United States Patent
Liu et al.

(10) Patent No.: US 8,270,182 B2
(45) Date of Patent: Sep. 18, 2012

(54) MOBILE PHONE WITH METAL HINGED SHIELD

(75) Inventors: Hsin-Hung Liu, Tu-Cheng (TW); Tsung-Lin Hsieh, Tu-Cheng (TW)

(73) Assignee: Hon Hai Precision Industry Co., Ltd., Tu-Cheng, New Taipei (TW)

(*) Notice: Subject to any disclaimer, the term of this patent is extended or adjusted under 35 U.S.C. 154(b) by 85 days.

(21) Appl. No.: 12/949,823

(22) Filed: Nov. 19, 2010

(65) Prior Publication Data

US 2012/0106119 A1 May 3, 2012

(51) Int. Cl.
*H05K 9/00* (2006.01)
(52) U.S. Cl. .......... 361/816; 361/800; 361/818
(58) Field of Classification Search .......... 361/753, 361/799, 800, 816, 818; 174/350, 372, 375, 174/377, 387, 395
See application file for complete search history.

(56) References Cited

U.S. PATENT DOCUMENTS

| | | | | |
|---|---|---|---|---|
| 5,614,694 A | * | 3/1997 | Gorenz et al. | 174/375 |
| 5,796,578 A | * | 8/1998 | Jones | 361/679.55 |
| 6,385,055 B1 | * | 5/2002 | Kramer et al. | 361/816 |
| 6,866,908 B2 | * | 3/2005 | Lichtenstein et al. | 428/35.7 |
| 7,089,646 B2 | * | 8/2006 | Leerkamp et al. | 29/592.1 |
| 7,446,265 B2 | * | 11/2008 | Krohto et al. | 174/377 |
| 2003/0092305 A1 | * | 5/2003 | Takeuchi | 439/342 |
| 2004/0022046 A1 | * | 2/2004 | Leerkamp et al. | 361/816 |

* cited by examiner

Primary Examiner — Hung S Bui

(74) Attorney, Agent, or Firm — Altis Law Group, Inc.

(57) ABSTRACT

The mobile phone includes a printed circuit board (PCB), a metal hinged shield, and a connecting member. The metal hinged shield is pivoted on the PCB by the connecting member. The metal hinged shield further comprises a high metal body and a low metal body. The high metal body partially overlaps the low metal body.

4 Claims, 5 Drawing Sheets

| Frequency (MHZ) | Antenna efficiency of conventional mobile phone(dB) | Antenna efficiency of the present disclosure(dB) |
|---|---|---|
| 820 | −7.61 | −4.70 |
| 830 | −6.56 | −3.99 |
| 840 | −5.99 | −3.67 |
| 850 | −5.42 | −3.33 |
| 860 | −5.05 | −3.02 |
| 870 | −5.22 | −3.04 |
| 880 | −5.55 | −3.24 |
| 890 | −6.00 | −3.58 |
| 900 | −6.48 | −3.94 |
| 1850 | −5.16 | −3.57 |
| 1870 | −5.18 | −3.68 |
| 1890 | −5.22 | −3.80 |
| 1910 | −5.24 | −3.85 |
| 1930 | −5.08 | −3.79 |
| 1950 | −5.08 | −3.87 |
| 1970 | −5.01 | −3.90 |
| 1990 | −4.98 | −3.99 |

FIG. 4

MOBILE PHONE WITH METAL HINGED SHIELD

BACKGROUND

1. Technical Field

The present disclosure relates to mobile phones and, particularly, to a mobile phone with a metal hinged shield.

2. Description of Related Art

For reducing high frequency noise of mobile phones or avoiding high frequency signal interference, a metal shielding cover is utilized for covering the chip of the mobile phone. As shown in FIG. 1, in the conventional mobile phone, four metal shielding covers 2, 3, 4, and 5 cover corresponding chips of a printed circuit board (PCB). However, because the size of each chip is different, the conventional mobile phone needs many different metal shielding covers and designing so many different moulds is also required, increasing the cost of the mobile phone.

Therefore, what is needed is a mobile phone to overcome the described shortcoming.

BRIEF DESCRIPTION OF THE DRAWINGS

FIG. 4 is a relationship table recording antenna efficiency between the conventional mobile phone of the FIG. 1 and the mobile phone of FIG. 2 in accordance with an exemplary embodiment.

DETAILED DESCRIPTION

Figure 1:
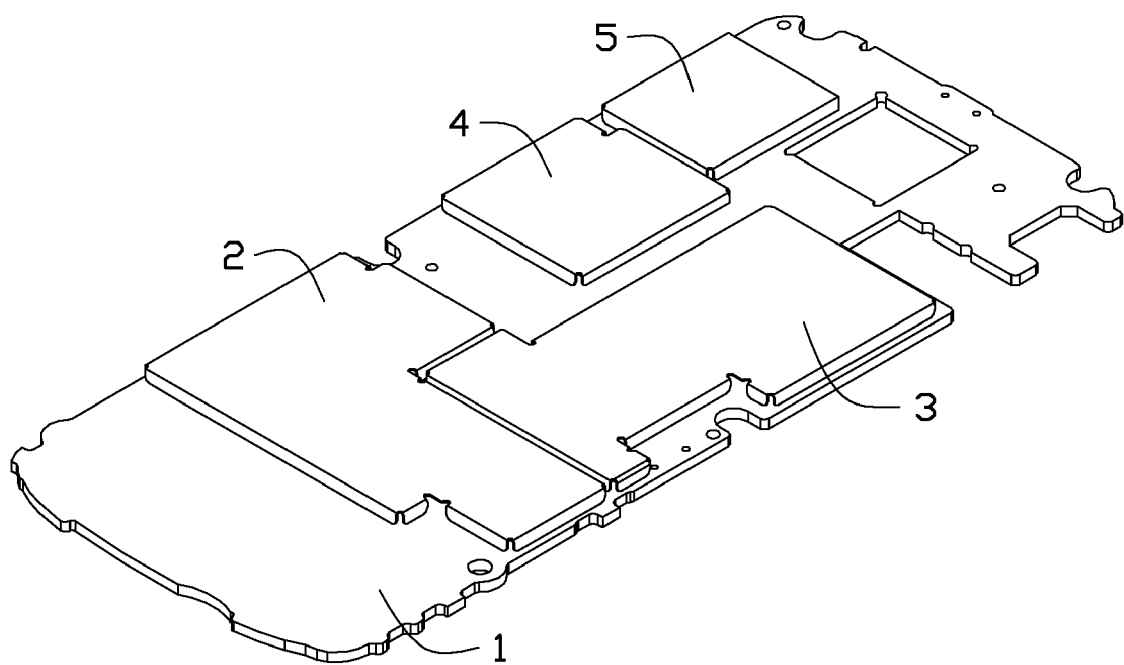
FIG. 1 is an isometric view of a PCB covered with metal shielding covers of a conventional mobile phone.
Figure 2:
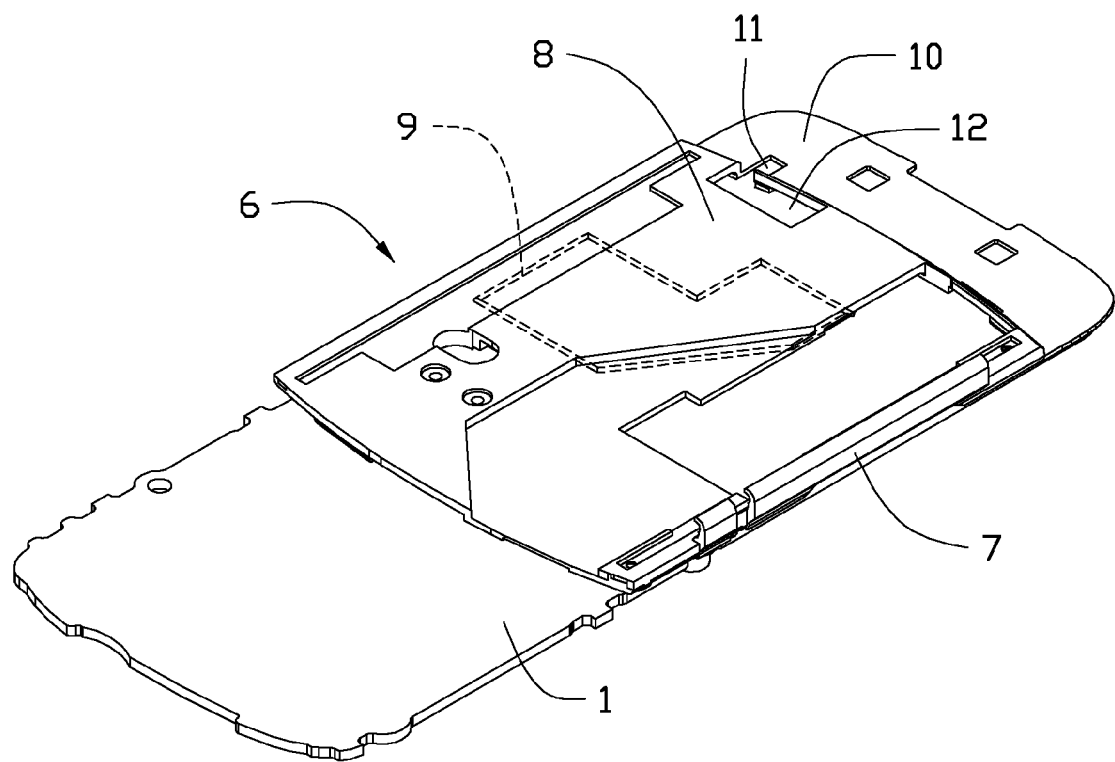
FIG. 2 is an isometric view of a PCB with a metal hinged shield of a mobile phone in accordance with an exemplary embodiment.
Figure 3:
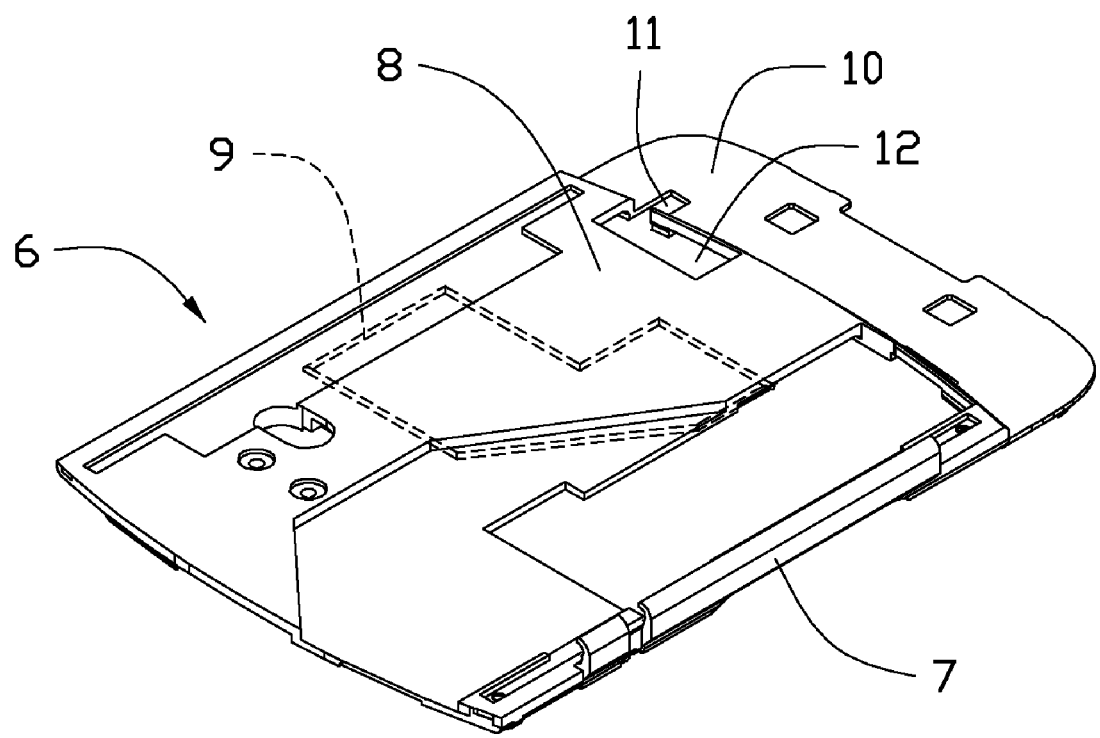
FIG. 3 is an isometric view of the metal hinged shield of the mobile phone of FIG. 2.

Referring to FIGS. 2 and 3, an embodiment of a mobile phone with a metal hinged shield (hereinafter the mobile phone) is illustrated. The mobile phone may be a bar type, a fold type, or a slide type. The mobile phone includes a printed circuit board (PCB) 1, a metal hinged shield 6, a connecting member 7, and a conductive sponge 9. In the embodiment, components that are not needed in illustrating the principles of the embodiment of the mobile phone are not shown in FIGS. 2 and 3.

The metal hinged shield 6 is pivoted on the PCB 1 by the connecting member 7 and thus covers the chips on the PCB 1. The metal hinged shield 6 is a substantially sheet shaped and the size of the metal hinged shield 6 is less than that of the PCB 1. In the embodiment, the metal hinged shield 6 is closed at an antenna end of the mobile phone. The metal hinged shield 6 is composed of metallic conductive materials (e.g., copper, aluminum, or silver), or a combination of a number of metallic conductive materials. In another embodiments, the metal hinged shield 6 is pivoted between the PCB 1 and another circuit board (not shown), that is, one end of the metal hinged shield 6 is connected with the PCB 1 and the other end of the metal hinged shield 6 is connected with the another circuit board. Accordingly, the PCB 1 and the another circuit board are jointed together by the metal hinged shield 6.

The conductive sponge 9 is clamped between the metal hinged shield 6 and the PCB 1. The conductive sponge 9 is compact, therefore, avoiding collision between the metal hinged shield 6 and the PCB 1.

The metal hinged shield 6 further includes a high metal body 8 and a low metal body 10. The high metal body 8 partially overlaps the low metal body 10. One end of the high metal body 8 overlaps on one end of the low metal body 10. Further, the one end of the high metal body 8 defines an opening 11, as well the one end of the low metal body 10 defines an opening 12. The two openings 11 and 12 communicate with each other to form a closed loop.

With such metal hinged shield 6, the mobile phone achieves a good performance which is shown in detail as antenna efficiency as follows in FIGS. 4 and 5.

Referring to FIG. 4, the relationship table includes a frequency column, an antenna efficiency of a conventional mobile phone column, and an antenna efficiency of the mobile phone with metal hinged shield column. The frequency column records a number of radio frequency channels, such as 900 MHZ, 1950 MHZ. Antenna efficiency by way of a parameter of a mobile phone is tested in each frequency channel. For example, in the 900 MHZ, the antenna efficiency of the conventional mobile phone is −6.48 dB and the antenna efficiency of the mobile phone with metal hinged shield is −3.94 dB, and in 1990 MHZ, the antenna efficiency of the conventional mobile phone is −4.98 dB and the antenna efficiency of the mobile phone is −3.99 db. Therefore, the antenna efficiency of the mobile phone with metal hinged shield is greater than the conventional mobile phone from the test data.

Figure 5:
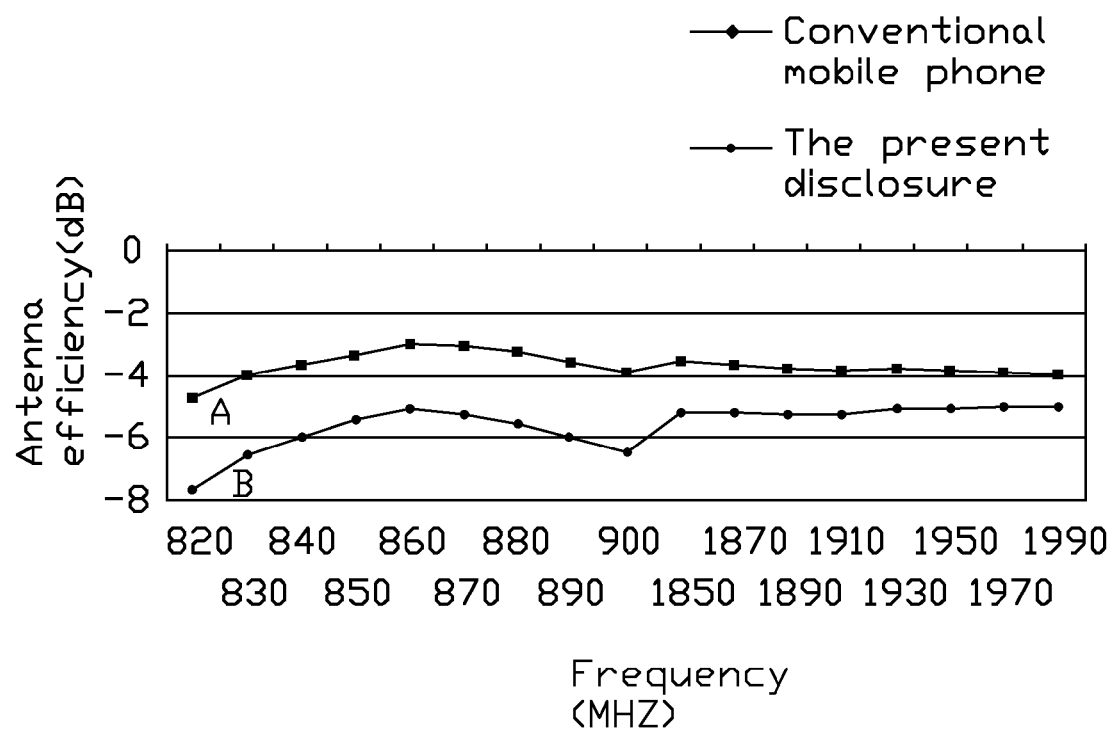
FIG. 5 is a graph diagram of antenna efficiency between the conventional mobile phone of FIG. 1 and the mobile phone of FIG. 2 in accordance with an exemplary embodiment.

Referring to FIG. 5, the X-axis represents the frequency channel and the Y-axis represents the antenna efficiency. A curved line "A" describes the distribution of the antenna efficiency of the conventional mobile phone and a curved line "B" describes the distribution of the antenna efficiency of the mobile phone with metal hinged shield. Accordingly, after the metal hinged shield 6 replaces all metal shielding covers on the PCB, the mobile phone with metal hinged shield not only saves money, but also achieves a better performance compared to the conventional mobile phone.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A mobile phone, comprising:
   a printed circuit board (PCB);
   a metal hinged shield comprising a high metal body and a low metal body, the high metal body partially overlapping the low metal body; and
   a connecting member;
   wherein the metal hinged shield is pivoted on the PCB by the connecting member, one end of the high metal body overlaps on one end of the low metal body, the one end of the high metal body defines a first opening, and the one end of the low metal body defines a second opening, and both the first opening and the second opening communicate with each other to form a closed loop.

2. The mobile phone as descried in claim 1, further comprising a conductive sponge clamped between the metal hinged shield and the PCB.

3. The mobile phone as described in claim 1, wherein the metal hinged shield is a substantially sheet shaped.

4. The mobile phone as described in claim 1, wherein the size of the metal hinged shield is less than that of the PCB.

* * * * *